United States Patent [19]
Mahant-Shetti et al.

[11] Patent Number: 5,789,956
[45] Date of Patent: Aug. 4, 1998

[54] LOW POWER FLIP-FLOP

[75] Inventors: Shivaling S. Mahant-Shetti, Dallas; Robert J. Landers, Plano, both of Tex.

[73] Assignee: Texas Instruments Incorporated, Dallas, Tex.

[21] Appl. No.: 451,875

[22] Filed: May 26, 1995

[51] Int. Cl.$^6$ .......................... H03K 3/289; H03K 3/356
[52] U.S. Cl. .................... 327/202; 327/203; 327/208
[58] Field of Search ........................ 327/199, 200, 327/201, 202, 203, 215, 218, 219, 208, 210, 211, 212, 214, 389

[56] References Cited

U.S. PATENT DOCUMENTS

| | | | |
|---|---|---|---|
| 4,656,368 | 4/1987 | McCombs et al. | 327/202 |
| 4,794,276 | 12/1988 | Sasada et al. | 327/202 |
| 4,806,786 | 2/1989 | Valentine | 327/203 |
| 5,212,411 | 5/1993 | Asazawa | 327/203 |
| 5,264,738 | 11/1993 | Veendrick et al. | 327/203 |
| 5,281,865 | 1/1994 | Yamashita et al. | 327/202 |
| 5,508,648 | 4/1996 | Banik | 327/203 |
| 5,552,738 | 9/1996 | Ko | 327/203 |

OTHER PUBLICATIONS

Kojima et al., "Half-Swing Clocking Scheme for 75% Power Saving in Clocking Circuitry," 1994 *Symposium on VLSI Circuits Digest of Technical Papers*, IEEE Cat. No. 94CH3434–8, Jun. 1994, pp. 23–24.

*Primary Examiner*—My-Trang Nu Ton
*Attorney, Agent, or Firm*—W. James Brady, III; Richard L. Donaldson

[57] ABSTRACT

A flip-flop circuit which includes a master section (1) having a pair of back to back connected inverters (5, 7) to form a latch circuit with their ground terminals connected together. The clock signal is coupled to the ground terminal of the inverters (5,7) to provide a negative gate to source voltage rather than an essentially zero gate to source voltage as used in prior art inverters to insure full turn off of the inverter transistors (40, 45) during their off periods and conserving power thereby. When the first phase of the clock signal goes high, the signal on the data line is fed to one side of the latch and the other side of the latch is coupled to ground or reference voltage. When the first phase of the clock then goes low, the signal from the data line is latched into the latch of the master section (1) and the other side of that latch is decoupled from ground. Also, when the first phase of the clock signal goes low and the second phase of the clock signal concurrently goes high, the signal latched in the latch of the master section (1) is fed to the slave section (3). The slave section (3) is identical to the master section (1) except that the clock signals received are of opposite phase or state to the clock signals received by the master section (1) and the input to the slave section (3) is the signal latched into the latch of the master section (1). The signal stored in the latch of the slave section (3) is the output of the flip-flop.

4 Claims, 1 Drawing Sheet

LOW POWER FLIP-FLOP

BACKGROUND OF THE INVENTION

1. Field Of The Invention

This invention relates to flip-flops and, more specifically, to low swing clock based low power flip-flops.

2. Brief Description Of The Prior Art

In a typical semiconductor chip, between 20 and 30 percent of the power required for operation is utilized by clocks. This is because the clock signals, especially in CMOS circuits, swing "from rail to rail" or from $V_{cc}$ to reference voltage or ground. This consumes a great deal of power, especially with very large chips. Proper non-overlap of the clock signals must be maintained throughout the chip for proper circuit operation.

One prior art mechanism for reducing clock power is the use of reduced swing clock signals with voltage swings being a fraction of $V_{cc}$. This is quite effective since power is dissipated in accordance with the square of the voltage and the circuit capacitance ($\sim CV^2$). Such a prior art mechanism is set forth in an article entitled "Half-Swing Clocking Scheme for 75% Power Saving in Clocking Circuitry" by Hirotsugu Kojima et al., 1994 *Symposium on VLSI Circuits Digest of Technical Papers*, June, 1994. In this circuit, the clock signal swings from reference voltage to ½ $V_{cc}$. However, the circuit also converts from a single clock line to four clock lines, two of the clock lines being out of phase and swinging from reference voltage to $V_{cc}/2$ and the other two clock lines being out of phase and swinging from $V_{cc}$ to $V_{cc}/2$. This presents a problem in that this circuit has about four times the capacitance of a circuit with a single clock line. Therefore, though there is improvement in power consumption due to the reduced voltage swing, this improvement is somewhat offset by the increase in circuit capacitance.

SUMMARY OF THE INVENTION

In accordance with the present invention, there is provided a flip-flop which utilizes less power than prior art flip-flops by use of the mechanism of reduction of the "rail to rail" voltage of the clock signal as well as by application of the clock signal directly to the inverter ground terminal.

Briefly, a single clock signal that swings from about $V_{cc}/2$ to reference potential or ground is converted into two clock signals that are out of phase. The circuit includes a master section having a pair of back to back connected inverters to form a latch circuit with their ground terminals connected together. The clock signal is coupled to the ground terminal of the inverters, this being a novel arrangement, clock signals to inverters generally being connected to gates of pass devices. This arrangement provides a negative gate to source voltage rather than an essentially zero gate to source voltage as used in prior art inverters, thereby insuring full turn off of the inverter transistors during their off periods and conserving power thereby. When the first phase of the clock signal goes high, the signal on the data line is fed to one side of the latch and the other side of the latch is coupled to ground or reference voltage. When the first phase of the clock then goes low, the signal from the data line is latched into the latch of the master section and the other side of that latch is decoupled from ground. Also, when the first phase of the clock signal goes low and the second phase of the clock signal concurrently goes high, the signal latched in the latch of the master section is fed to the slave section. The slave section is identical to the master section except that the clock signals received are of opposite phase to the clock signals received by the master section and the input to the slave section is the signal latched into the latch of the master section. The slave section has a pair of back to back connected inverters with their ground terminals connected together. When the second phase of the clock signal goes high, the signal in the latch of the master section is fed to one side of the latch of the slave section and the other side of the latch of the slave section is coupled to ground or reference voltage. When the second phase of the clock then goes low, the signal from the latch of the master section is latched into the latch of the slave section and the other side of the latch of the slave section is decoupled from ground. The signal stored in the latch of the slave section is the output of the flip-flop.

It can be seen that only two out of phase clock lines are required and these clock lines operate at about $V_{cc}/2$, it merely being necessary that the voltage of the clock signals be higher than the transition voltages ($V_t$) of the transistors being driven by the signal on the clock lines.

DESCRIPTION OF THE PREFERRED EMBODIMENT

Figure 1:
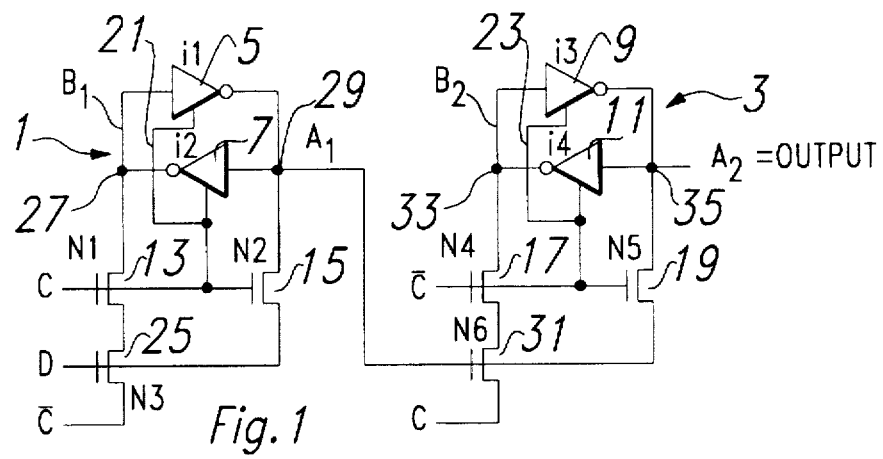
FIG. 1 is a circuit diagram of a flip-flop in accordance with the present invention.
Figure 3:
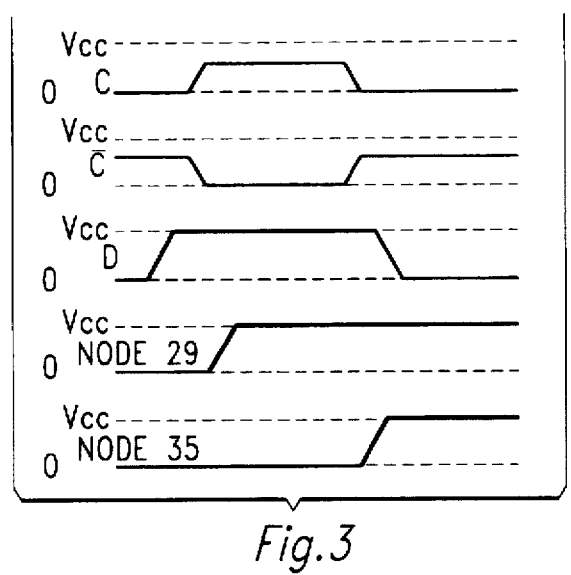
FIG. 3 is a timing diagram showing the signals on various lines in the circuit of FIG. 1.

Referring to FIG. 1, there is shown an SRAM type flip flop in accordance with the present invention. The circuit is in the form of identical master 1 and slave 3 sections, the master section having back to back inverters 5 and 7 which form a latch and the slave section having identical back to back inverters 9 and 11 which form a latch. A pair of input transistors 13 and 15, controlled by the clock signal C (as shown in FIG. 3) which is $V_{cc}/2$ or zero, are each connected to a different one of the junctions of inverters 5 and 7 at nodes 27 and 29 respectively. A pair of input transistors 17 and 19, controlled by the clock signal C bar (as shown in FIG. 3), are each connected to a different one of the junctions of inverters 9 and 11 at nodes 33 and 35 respectively. The clock signal C also is coupled to the ground line 21 of both of the inverters 5 and 7 and the clock line C bar also is coupled to the ground line 23 of both of the inverters 9 and 11. This feature is important in small technologies in assisting in turning off the transistors of the inverter with which it is associated. This minimizes leakage and reduces power consumption.

Figure 2:
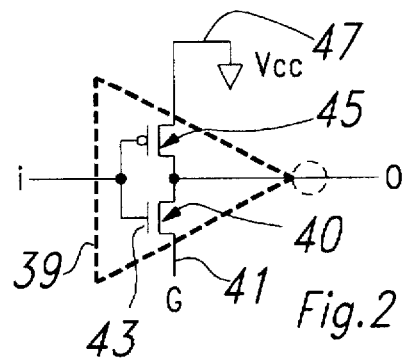
FIG. 2 is a circuit diagram of a typical inverter circuit as used in the flip-flop of FIG. 1.

With reference to FIG. 2, which is a circuit diagram of any one of the inverters 5, 7, 9 and 11, the inverter 39 includes an n-channel transistor 40 with source 41 and gate 43 in series with a p-channel transistor 45 having a gate coupled to the gate of transistor 40 and a source 47 coupled to $V_{cc}$. By raising the voltage of the source 41 (ground line 21 of FIG. 1) of inverter transistor 40 to $V_{cc}/2$ when the gate 43 of that transistor is generally at reference or ground potential, leakage is minimized because conduction of the transistor 40 is determined by $V_{gs}$ and the voltage difference between the gate 43 and the source 41 provides a negative $V_{gs}$ whereas normal circuits generally are arranged to provide a zero voltage difference. Also, since the data signal D (see FIG. 3) is $V_{cc}$, transistor 15 will have an even greater negative $V_{gs}$ and will be turned off.

In operation, with the clock C line in the low or ground potential state, the latch of the master circuit 1 holds whatever signal was last latched therein. This turns off transistors 13 and 15. Inverters 5 and 7 appear as regular inverters with the source 41 of the n-channel device 40 of these inverters being at ground potential. When the clock C line is turned on or at $V_{cc}/2$, transistors 13 and 15 are turned on and whatever signal is on signal line D is passed to the latch of master circuit 1 at node 29. If the signal on signal line D is high, then transistor 25 is turned on. This provides a conduction path from node 27 to ground on signal line C bar through on transistors 13 and 25 and places ground potential at node 27 and $V_{cc}$ at node 29. The effect is that the state of signal line D has been passed into the latch of master circuit 1. If the clock signal C is now lowered, the state stored in the latch of master circuit 1 will remain latched therein with transistors 13 and 15 being turned off.

The slave circuit 3 operates in the identical manner discussed for the master section except that operation is in the opposite phase. With the clock C bar line in the low or ground potential state, the latch of the slave circuit 3 holds whatever signal was last latched therein. This turns off transistors 17 and 19. Inverters 9 and 11 appear as regular inverters with the source 41 of the n-channel device 40 of these inverters being at ground potential. When the clock C bar line is turned on or at $V_{cc}/2$ and the clock C line goes low, transistors 17 and 19 are turned on and whatever signal is on node 29 is passed to the latch of slave circuit 3 at node 35. If the signal on node 29 is high, then transistor 31 is turned on. This provides a conduction path from node 33 to ground on signal line C through on transistors 17 and 31 and places ground potential at node 33 and $V_{cc}$ at node 35 which is the output of the circuit and usually designated as "Q" in the flip-flop art. At this point, the original input at signal line D has reached the output of the flip-flop and is latched into the slave circuit 3. The effect is that the state of node 29 has been passed into the latch of slave circuit 3. If the clock signal C bar is now lowered, the state stored in the latch of slave circuit 3 will remain latched therein with transistors 17 and 19 being turned off.

It can be seen that the latches of the master circuit 1 and the slave circuit 3 operate out of phase with each other such that when master latch is accepting inputs, the slave latch is holding the old signal and when the slave latch is accepting the last input from the master, the master latch is also holding that input until it has been latched into the slave whereupon the master is then set to receive the next data signal on signal line D in conjunction with the timing signals as discussed above. Information is transferred from the master section to the slave section only when there is a change of state of the clock. Though the clock signals have been described as swinging between $V_{cc}/2$ and zero, it should be understood that it is merely necessary that the clock signals be above the transition voltage, $V_r$ of the transistors operated by the clock signals for operation to take place. The greater the clock signal is above $V^r$, the faster the circuit will operate. It is also apparent that only a C and C bar signal are required as opposed to the complex circuitry and four clock signals required by the above noted prior art.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A flip-flop circuit which comprises:

a master section including a first latch circuit and first pass circuitry, said first latch circuit having a pair of inverters connected back to back between a first node and a second node, each of said inverters having a ground terminal for receiving a clock signal having a first state, said first pass circuitry having first, second and third transistors, said first and second transistors having gate electrodes for receiving said clock signal, said third transistor having a gate electrode for receiving a data signal, said first and third transistors having current paths coupled in series between said first node and a terminal for receiving an inverted clock signal having a second state opposite said first state, said second transistor having a current path coupled between said second node and a terminal for receiving said data signal; and a slave section including a second latch circuit and second pass circuitry, said second latch circuit having a pair of inverters connected back to back between a third node and a fourth node, each of said inverters having a ground terminal for receiving said inverted clock signal, said second pass circuitry having fourth, fifth, and sixth transistors, said fourth and fifth transistors having gain electrodes for receiving said inverted clock signal, said sixth transistor having a gate electrode coupled to said second node, said fourth and sixth transistors having current paths coupled in series between said third node and a terminal for receiving said clock signal, said fifth transistor having a current path coupled between said fourth node and said second node.

2. The flip-flop circuit of claim 1 in which an amplitude of said data signal is about twice an amplitude of said clock signal and said inverted clock signal.

3. The flip-flop circuit of claim 1 in which said first, second, third, fourth, fifth, and sixth transistors are n-channel transistors.

4. The flip-flop circuit of claim 2 in which each of said inverters includes a series circuit of a p-channel and an n-channel transistor coupled between a voltage source and said ground terminals.

* * * * *